US012743030B2

(12) United States Patent
Subrahmanyan

(10) Patent No.: US 12,743,030 B2
(45) Date of Patent: Sep. 22, 2026

(54) FREQUENCY AND AMPLITUDE MODULATION OF IMPLANT DOSE FOR STRESS MANAGEMENT

(71) Applicant: Applied Materials, Inc., Santa Clara, CA (US)

(72) Inventor: Pradeep K. Subrahmanyan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 584 days.

(21) Appl. No.: 18/124,343

(22) Filed: Mar. 21, 2023

(65) Prior Publication Data

US 2024/0103385 A1 Mar. 28, 2024

Related U.S. Application Data

(60) Provisional application No. 63/410,977, filed on Sep. 28, 2022.

(51) Int. Cl.
*G06F 11/30* (2006.01)
*G03F 7/00* (2006.01)

(52) U.S. Cl.
CPC ........ *G03F 7/7085* (2013.01); *G03F 7/70783* (2013.01); *G03F 7/70883* (2013.01)

(58) Field of Classification Search
CPC ..................................................... G03F 7/7085
See application file for complete search history.

(56) References Cited

U.S. PATENT DOCUMENTS

| | | | |
|---|---|---|---|
| 9,698,223 | B2 | 7/2017 | Sharangpani et al. |
| 9,978,582 | B2 | 5/2018 | Batinica et al. |
| 10,763,099 | B2 | 9/2020 | Dai et al. |
| 10,784,144 | B2 | 9/2020 | Mathew et al. |
| 10,804,197 | B1 | 10/2020 | Kawasaki et al. |
| 2015/0294917 | A1 | 10/2015 | deVilliers |
| 2015/0371908 | A1 | 12/2015 | Bencher et al. |
| 2018/0342410 | A1 | 11/2018 | Hooge et al. |
| 2020/0118822 | A1 | 4/2020 | Falk et al. |
| 2021/0050446 | A1 | 2/2021 | Sun et al. |

(Continued)

FOREIGN PATENT DOCUMENTS

WO 2022119732 A1 6/2022

OTHER PUBLICATIONS

Architecture and Process Integration Overview of 3D Nand Flash Technologies, Applied Sciences. Geun Ho Lee et al. Appl. Sci. 2021, 11, 6703. https://doi.org/10.3390/app11156703.

(Continued)

*Primary Examiner* — Phuong Huynh
(74) *Attorney, Agent, or Firm* — Patterson + Sheridan, LLP

(57) ABSTRACT

Embodiments of the disclosure relate to techniques and apparatus for reducing out-of-plane distortion (OPD) in a substrate, as well as control of the effects of OPD and the effects that the modifications made to the substrate to correct for the OPD have on subsequent substrate processing operations performed on the substrate. The present embodiments employ novel techniques to reduce the OPD in a substrate without adding or modifying portions of the substrate that will create issues in subsequent substrate fabrication processes.

14 Claims, 9 Drawing Sheets
(5 of 9 Drawing Sheet(s) Filed in Color)

(56) References Cited

U.S. PATENT DOCUMENTS

2021/0198804 A1 * 7/2021 Khlebnikov ............ C30B 29/36

OTHER PUBLICATIONS

International Search Report and Written Opinion dated Dec. 12, 2023 for Application No. PCT/US2023/030896.

Taiwan Office Action Dated Nov. 20, 2025 for Application No. 112132430.

Office Action from Japanese Patent Application No. 2025-518033, dated May 26, 2026.

* cited by examiner

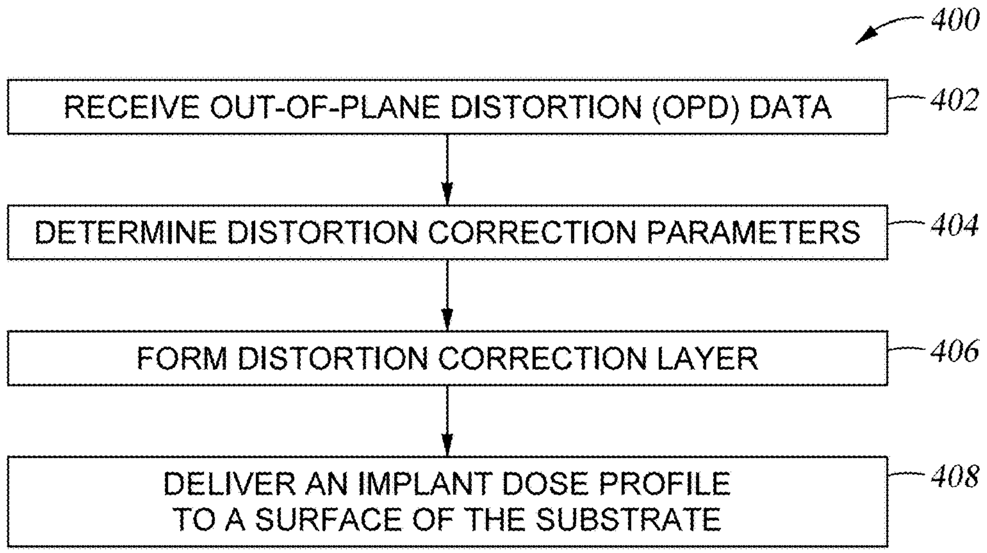

GENERATE GAUSSIAN ION BEAM PROFILE BASED ON SHAPE OF THE INCIDENT BEAM — 452

454
1. RESAMPLE GAUSSIAN ION BEAM PROFILE TO MATCH OPD DATA GRID SIZE TO GENERATE BLUR KERNEL
2. COMPUTE CURVATURE DATA FROM OPD DATA
3. APPLY BLUR KERNEL TO CURVATURE DATA 456
1. GENERATE INVERSE GAUSSIAN FILTER
2. APPLY INVERSE GAUSSIAN FILTER TO LOW-PASS FILTERED OPD DATA TO GENERATE CORRECTED CURVATURE DATA

COMPUTE IMPLANT DOSE MAP BASED ON DOSE SENSITIVITY CURVE AND THE CORRECTED CURVATURE DATA — 458

406

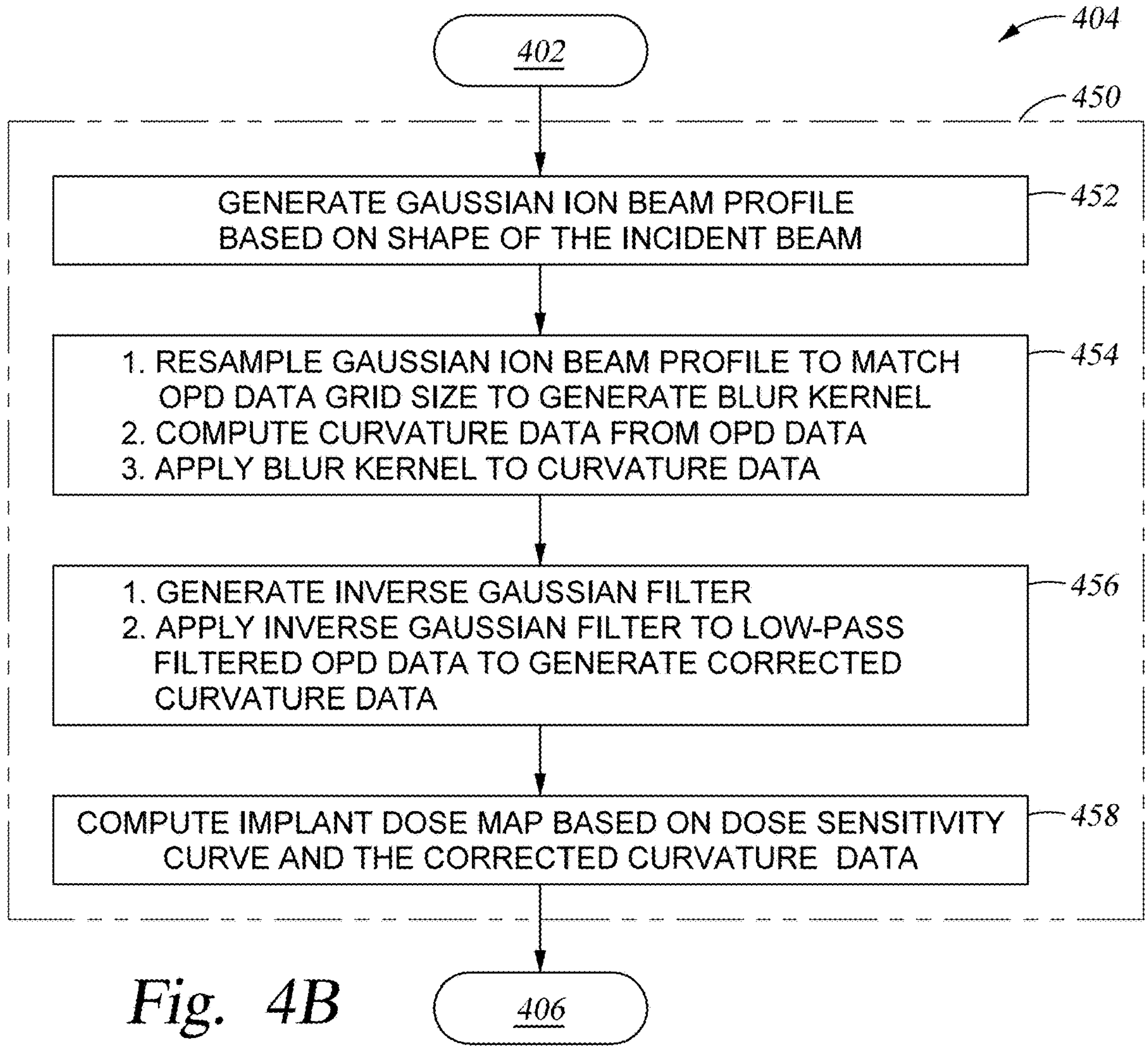

*Fig. 4B*

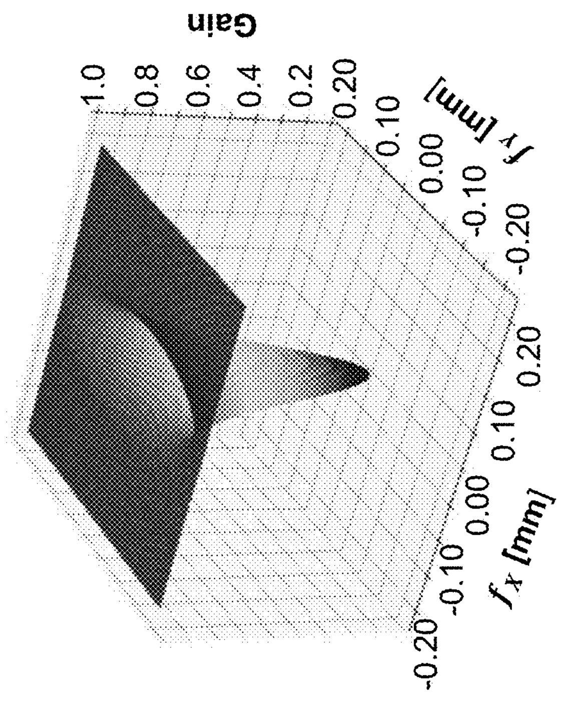
Filter to correct lower frequencies
*Fig. 5E*
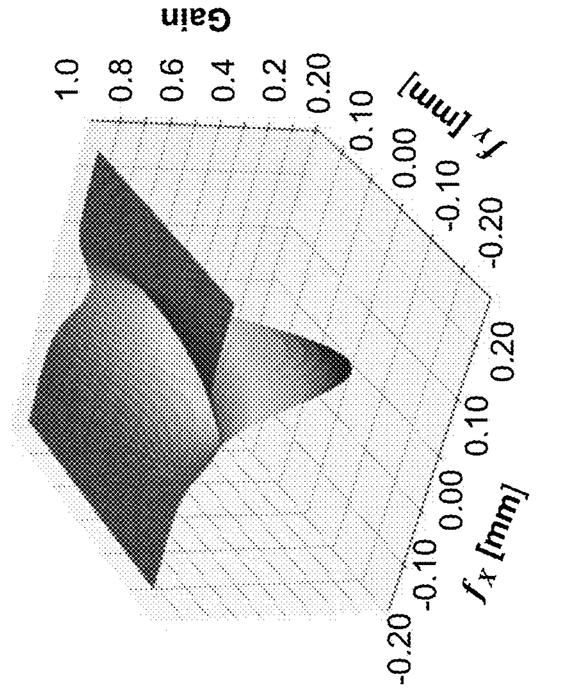
Resample to match data Grid
*Fig. 5F*

Gain 50
Gain 100
E+14
Dose (#/cm²)
1.6
1.4
1.2
1.0
0.8
0.6
0.4
X [mm]
Y [nm]
-100
0
100
PSD [dB nm.mm]
300
280
260
240
220
200
0.5λx [mm]
0.5λy [mm]
4.6
6.2
9.2
18.5
∞

FREQUENCY AND AMPLITUDE MODULATION OF IMPLANT DOSE FOR STRESS MANAGEMENT

CROSS REFERENCE TO RELATED APPLICATIONS

This application claims the benefit of U.S. Provisional Patent Application Ser. No. 63/410,977, filed Sep. 28, 2022, which is hereby incorporated by reference.

BACKGROUND

Field

The present disclosure generally relates to stress control in substrates, and more particularly to stress compensation to reduce out-of-plane distortion in substrates.

Description of the Related Art

Memory devices are an essential component in digital electronic devices that are being developed today. With the increase in technology today, there is a need for increased memory capacity in most electronic devices. At the same time there is also a need for smaller memory devices to meet the market place's desire to create smaller electronic devices in which the memory device is positioned within.

In recent years, conventional (2D) NAND memory devices have run into a number of challenges, including voltage drop related issues (e.g., running out of electrons in the current carrying elements due to the ever scaling of the cell size), retention loss and overall reliability. To address these challenges encountered in scaling planar (2D) NAND memory devices to achieve higher densities at a lower cost per bit, ultra-high density, three-dimensional (3D) stacked memory structures have been introduced. Such 3D memory structures are sometimes referred to as having a Bit Cost Scalable (BiCS) architecture, and include strings of vertically integrated memory cells. Typically, the vertically aligned memory cells are formed from an array of alternating conductor and insulator layers, where the conductive layers correspond to the word lines of the memory structure.

As the number of vertically stacked memory cells in 3D NAND devices increases (e.g., as chip densities increase), the stress created within the stacked memory cells increases, which increase the substrate bow and introduces numerous performance issues. Local variations in the material composition in the vertically stacked memory cells may induce stress that deforms or warps the semiconductor substrate upon which structures are formed. Substrate flatness or bow has a very large influence on semiconductor device fabrication because of the impact it can have on the ability of photolithography systems to effectively form device patterns on a surface of the substrate. Even moderate changes in surface topography within the area of the photolithography exposure can either alter the device feature patterns or affect the overlay between subsequent layers. This will ultimately lead to potential die yield loss. For accurate formation device patterns, it is important to form a pattern on a substrate while the substrate remains relatively flat or planar. Substrate bow is also important for other related fabrication processes, since deformation or warping of a substrate may also cause difficulty in subsequent processing steps that may include chip bonding or packaging.

One general concern for fabricating such devices and structures on a substrate is the development of in-plane distortion (IPD), which affects the overlay of a layer with respect to an underlying reference layer. IPD is a complex quantity affected by both the out-of-plane distortion (OPD) of the substrate and the alignment scheme employed in photolithography. Wafer processing may generate complex patterns of OPD across a substrate at any given stage of processing that may tend to affect subsequent processing operations. As an example, a semiconductor substrate may be patterned into regular arrays of die regions corresponding to die to be cut from the semiconductor wafer. In a particular example, the complex patterns of OPD may generate overlay errors in a subsequent lithographic masking operation.

Therefore, there is a need for an improved method and formed structure that can reduce or eliminate distortions found in a substrate.

SUMMARY

Embodiments of the present disclosure provide a method of altering a shape of a substrate. The method includes generating an ion beam profile based on a measured shape of an ion beam, resampling the ion beam profile to generate a blur kernel, by adjusting a resolution of the ion beam profile to match a resolution of an out-of-plane distortion (OPD) data measured on the substrate, computing curvature data from the OPD data, filtering the curvature data by applying the blur kernel to the curvature data, generating an inverse filter, by Fourier transforming the ion beam profile and resampling the Fourier transformed ion beam profile by matching a resolution of the Fourier transformed ion beam profile to a resolution of the curvature data, applying the inverse filter to the filtered curvature data to generate corrected curvature data, and computing an implant dose map based on an empirically generated dose sensitivity curve and the corrected curvature data.

Embodiments of the present disclosure also provide a method of altering a deformed shape of a substrate. The method includes receiving out-of-plane distortion (OPD) data of a back-side surface of a substrate, computing an implant dose profile to deliver to the back-side surface of the substrate, including generating an ion beam profile based on a measured shape of an ion beam, resampling the ion beam profile to generate a blur kernel, by adjusting a resolution of the ion beam profile to match a resolution of an out-of-plane distortion (OPD) data measured on the substrate, computing curvature data from the OPD data, filtering the curvature data, by applying the blur kernel to the curvature data, generating an inverse filter, by Fourier transforming the ion beam profile and resampling the Fourier transformed ion beam profile by matching a resolution of the Fourier transformed ion beam profile to a resolution of the curvature data, applying the inverse filter to the filtered curvature data to generate corrected curvature data, and computing an implant dose profile based on an empirically generated dose sensitivity curve and the corrected curvature data, depositing a distortion correction layer on the back-side surface of the substrate, and applying an ion beam having the computed implant dose profile to the distortion correction layer.

Embodiments of the present disclosure further provide a semiconductor device containing substrate. The semiconductor device includes a plurality of semiconductor device layers formed on a front-side surface of a substrate, wherein the semiconductor device layers include at least one layer that includes a compressive or tensile stress that generate a deformed shape in the substrate that includes a varying amplitude at each of a plurality of frequencies, and a distortion correction structure that is formed on a back-side surface of the substrate, and includes a distortion correction layer that includes a first material that is disposed on the back-side surface and has a thickness, and an implanted dopant species that is distributed non-uniformly across a back-side surface of the first material disposed across the back-side surface of the substrate, wherein a dose of the implanted dopant species is non-uniform, and the combination of the first material and the addition of the implanted dopant species within the first material is configure to correct the deformed shape formed in the substrate.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 4A illustrates a method 400 of forming a distortion correction structure, according to one or more of the embodiments described herein.

FIG. 4B illustrates a method 450 of determining the implant profile used with the method 400 to form the distortion correction structure, according to one or more of the embodiments described herein.

FIG. 5E illustrates a Fourier transformed resampled Gaussian ion beam profile that has been generated based on the resampled Gaussian ion beam profile illustrated in FIG. 5D, according to one or more of the embodiments described herein.

FIG. 5F illustrates an inverse Gaussian filter that has been generated based on the Fourier transformed resampled Gaussian beam profile illustrated in FIG. 5E, according to one or more of the embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
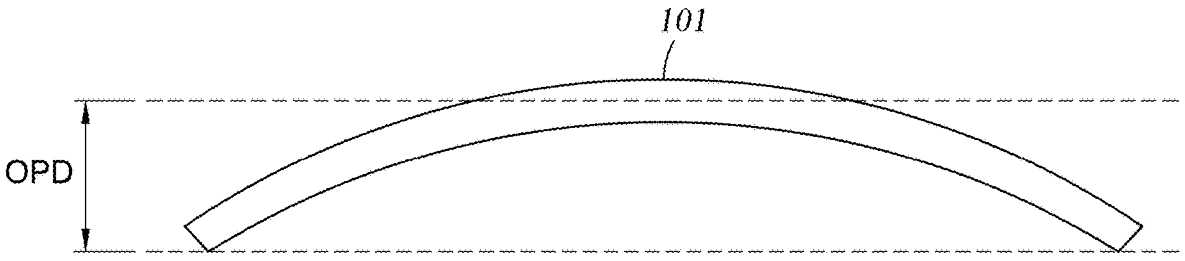
FIG. 1A is illustrates a substrate that includes a global out-of-plane-distortion.

In the following description, details are set forth by way of example to facilitate an understanding of the disclosed subject matter. It should be apparent to a person of ordinary skill in the field, however, that the disclosed implementations are exemplary and not exhaustive of all possible implementations. Thus, it should be understood that reference to the described examples is not intended to limit the scope of the disclosure. Any alterations and further modifications to the described devices, instruments, methods, and any further application of the principles of the present disclosure are fully contemplated as would normally occur to one skilled in the art to which the disclosure relates. In particular, it is fully contemplated that the features, components, and/or steps described with respect to one implementation may be combined with the features, components, and/or steps described with respect to other implementations of the present disclosure. As used herein, the term "about"

may refer to a +/−10% variation from the nominal value. It is to be understood that such a variation can be included in any value provided herein.

The embodiments described herein relate to techniques and apparatus for correcting complex out-of-plane distortion (OPD) shapes formed in a substrate. The present embodiments employ novel techniques to reduce the complex OPDs formed in a substrate by creating an implant profile that accounts for amplitude and spatial frequency variations created in a deformed substrate. It has been found that as the amount of spatial frequency variation increases within a deformed substrate the harder it is to correct for the amplitude variation created by the higher order spatial frequencies.

Embodiments of the disclosure include a distortion correction process that includes the deposition of a distortion correction layer 201 that has a thickness $T_{DCL}$, and then expose the as-deposited distortion correction layer 201 formed on the back-side surface 103 of the substrate 101 to an implant dose profile that is configured to account for and correct the complex OPD formed in a substrate.

As noted above, in one application example, as the number of vertically stacked memory cells in 3D NAND devices increases (e.g., as chip densities increase), the stress created within the stacked memory cells increases, which increases the complexity and amount of OPD within the substrate, and thus increases what is often referred to as "wafer bow" or "substrate bow". To compensate for complex substrate deformation shapes created by spatial frequency variations it is possible to develop implant dose profiles that separately account for each of the spatial frequencies present in the deformed shape of a substrate, such as deformation shapes that include first, second, third and fourth order deformation shapes, for example. Therefore, using this technique, the complex substrate deformation shapes can each be corrected by separately applying each of the separately derived implant dose profiles to the as-deposited distortion correction layer 201 to correct the complex OPD formed in the substrate. However, separately applying each of the separately derived implant dose profiles is time consuming and expensive.

Therefore, as noted above, the novel techniques disclosed herein are configured to reduce the complex OPDs formed in a substrate by creating an implant dose profile that accounts for both amplitude and spatial frequency variations created in a deformed substrate.

Distortion Correction Structure Formation Process

In an effort to eliminate or minimize the complex distortion shape formed in a deformed substrate, a distortion correction structure and process sequence to form the same has been developed and is disclosed herein.

Figure 1B:
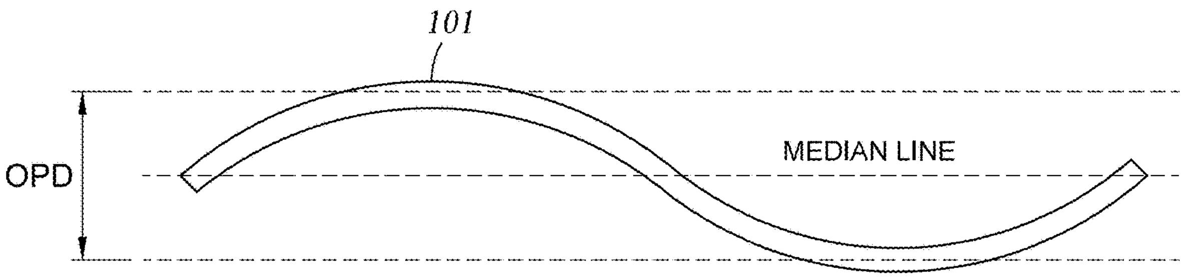
FIG. 1B is illustrates a substrate that includes an example of a more complex out-of-plane-distortion.

FIG. 1A is a side cross-section view of a substrate that has a significant global substrate bow created by a large OPD. The substrate 101 illustrated in FIG. 1A provides an example of a substrate that includes a first order deformation shape, and thus for a 300 millimeter (mm) semiconductor wafer the illustrated deformation shape has a wavelength (A) of 600 mm. As a further example, FIG. 1B is a side cross-section view of a substrate that includes a second order deformation shape, and thus for a 300 millimeter (mm) semiconductor wafer the illustrated deformation shape has a wavelength (A) of 300 mm. The amount of deflection created by the OPD can be measured at the center or neutral axis of the substrate 101 as illustrated in FIGS. 1A and 1B. In one example, the substrate 101 includes device structures formed on the device side surface 102 of the substrate 101 that are used to form 3D memory devices.

Figure 2:
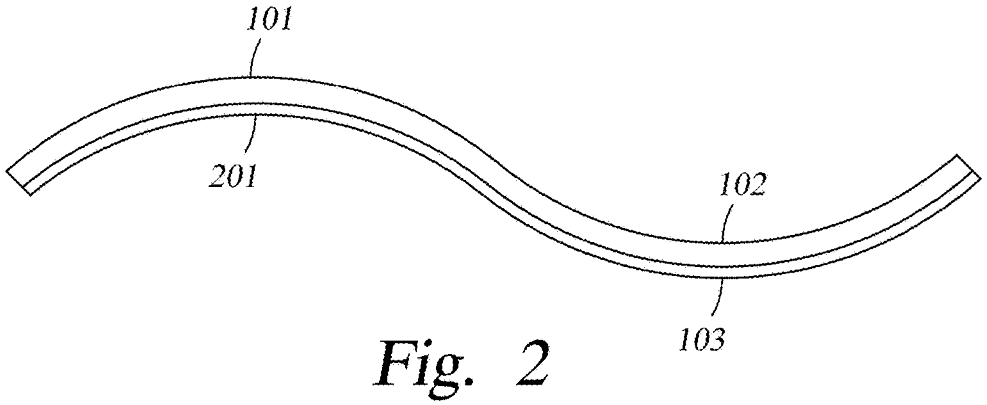
FIG. 2 illustrates a substrate that has a more complex out-of-plane-distortion after a distortion correction layer has been added to a rear surface of the substrate.

FIG. 2 is a side cross-sectional view of a substrate 101 after an as-deposited distortion correction layer 201 has been formed on the back-side surface 103 of the substrate 101, as illustrated in FIG. 1B. The as-deposited distortion correction layer 201 includes a thickness $T_{DCL}$ and is typically formed from a dielectric material. In one example, the as-deposited distortion correction layer 201 includes a silicon nitride (SiN) containing layer that has a thickness that is less than 10,000 angstroms (Å), such as less than 5,000 Å, or less than 4,000 Å, less than 2,000 Å, or even less than 1,500 Å.

Figure 3:
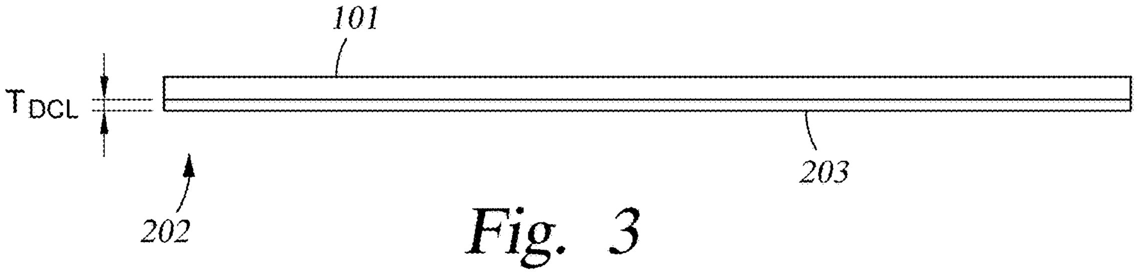
FIG. 3 illustrates the substrate shown in FIG. 2 after a distortion correction process has been performed thereon, according to one or more of the embodiments described herein.

FIG. 3 side cross-sectional view of a substrate 101 after the distortion correction structure formation processes illustrated in FIGS. 4A-4B have been performed on a substrate which had a complex deformation shape that included both amplitude and spatial frequency variations.

Figure 5B:
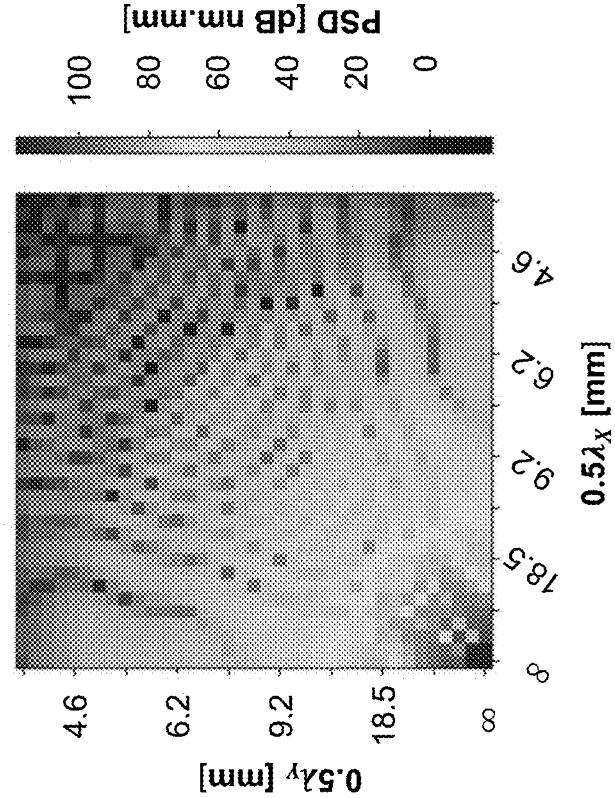
FIG. 5B illustrates power spectral density (PSD) data that corresponds to the OPD data illustrated in FIG. 5A.
Figure 5A:
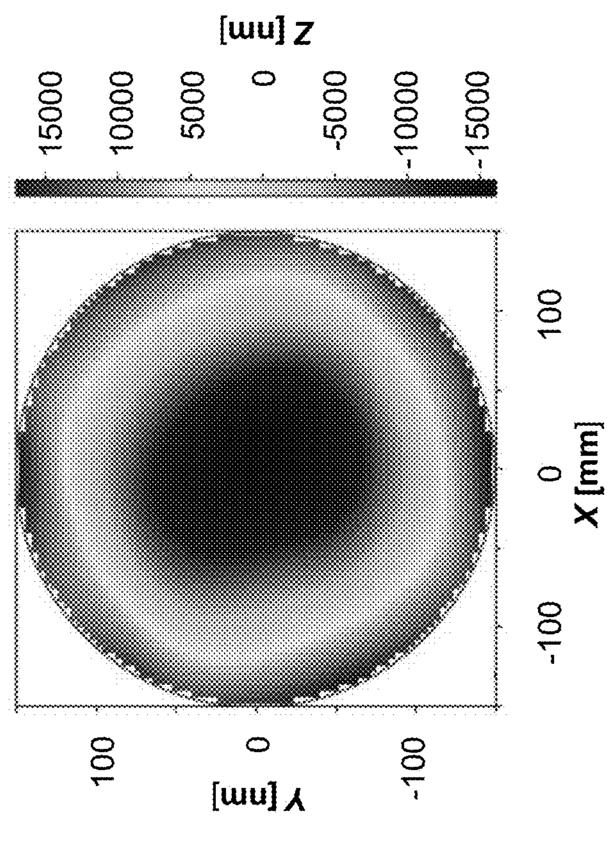
FIG. 5A illustrates out-of-plane distortion (OPD) data of an example substrate.
Figure 5D:
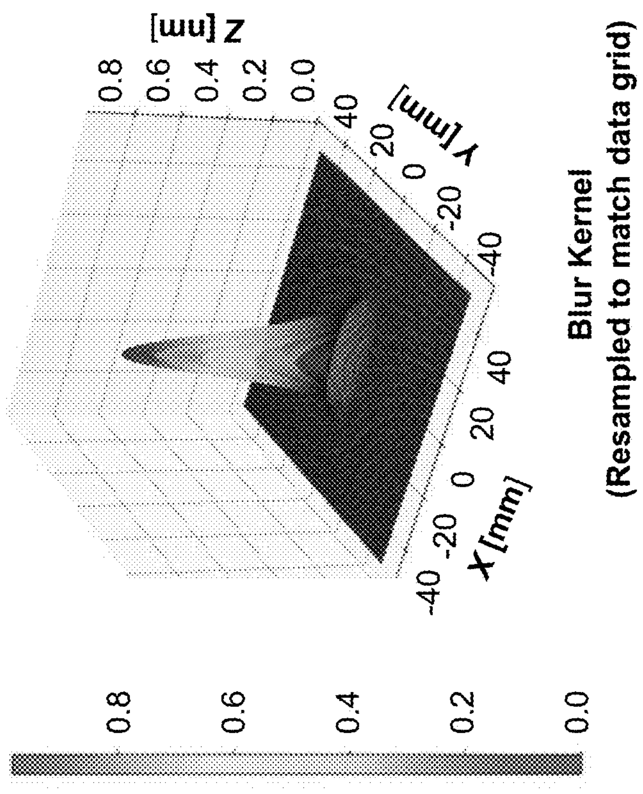
FIG. 5D illustrates a resampled Gaussian ion beam profile ("blur kernel") that has been generated based on the 3D shape of the Gaussian ion beam profile illustrated in FIG. 5C, according to one or more of the embodiments described herein.
Figure 5C:
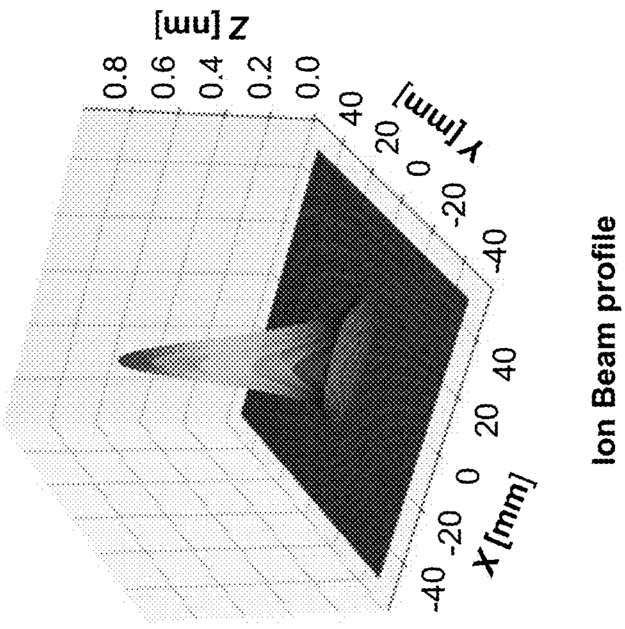
FIG. 5C is a three-dimensional (3D) representation of a Gaussian ion beam that can be used in one or more of the methods described herein, according to one or more of the embodiments described herein.
Figure 5G:
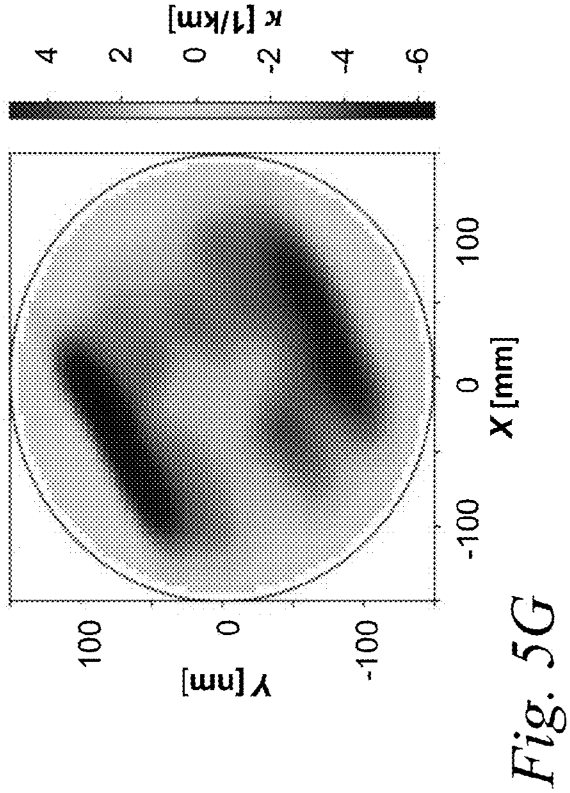
FIG. 5G illustrates curvature data of the example substrate that has been formed by applying one or more of the methods described herein to the OPD data illustrated in FIG. 5A, according to one or more of the embodiments described herein.
Figure 5H:
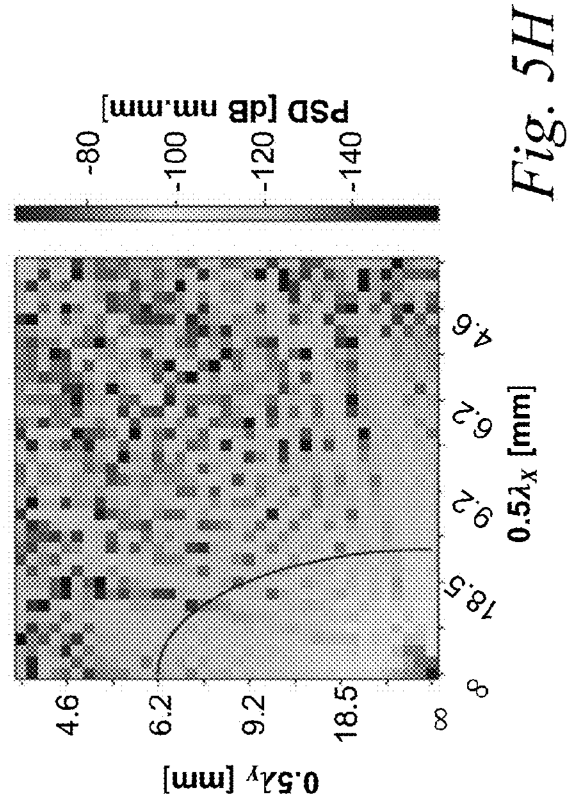
FIG. 5H illustrates PSD data that corresponds to the curvature data illustrated in FIG. 5G.

FIG. 4A illustrates one embodiment of a distortion correction structure formation process, which is referred to herein as method 400, that is used to form a distortion correction structure 202 that is used to compensate for a complex deformation shape found in a substrate 101, according to one or more of the embodiments described herein. The method 400 begins at activity 402, where OPD data of the complex deformation shape of a back-side surface of a substrate 101 is received. OPD data of an example substrate is shown in FIG. 5A. The OPD data that is a spatial map of displacement in the Z direction of the substrate 101 may be measured by use of a substrate bow measurement technique. In one example, the measurement technique is performed by use of a WaferSight™ tool available from KLA of Milpitas, California or other similar substrate bow measurement tool. An example power spectral density (PSD) data, which is computed by Fourier transforming the OPD data shown in FIG. 5A into a spatial frequency domain, is shown in FIG. 5B. The PSD data includes a plot of the amplitude of the power of the OPD at various spatial frequencies found in the deformed substrate. The spatial frequencies are plotted in an X-direction (i.e., frequency $f_x$) and a Y-direction (i.e., frequency $f_y$) and the amplitude information at each of the plotted spatial frequencies in the X-Y plot are illustrated by a color, where red signifies the largest amplitude and dark blue signifies the lowest amplitude. In this example, the X and Y axes define the variation in the spatial frequency of the deformation shapes in each of the measurement directions. The higher power spectral densities (PSDs), which are plotted on a dB scale, include red regions near the origin of the plot in FIG. 5B, and the lower power spectral frequency densities include dark blue regions furthest from the origin. As a reference, the square positioned at the origin represents a spatial frequency that has a wavelength that is 600 mm and the squares positioned at the furthest distance along each of the X and Y axes from the origin represent a spatial frequency that has a wavelength that is 8 mm (corresponding to a sub-sampled pixel size of 4 mm), which should be noted is set by limitations in the measurement technique performed by bow measurement tool and thus is not intended to limiting as to the scope of the disclosure provided herein. FIG. 5G illustrates the curvature of the wafer following the various activities performed in method 400 and FIG. 5H illustrates the corresponding PSD data. The PSD data illustrated herein is only provided as an example of processing a substrate described herein, and is not intended to be limiting as to the scope of the disclosure provided herein.

At activity 404, a system controller (not shown) within one or more distortion correction structure processing tools determines a desired amount of correction that is required to correct for amplitude and spatial frequency variations created in a deformed substrate due to the application of a non-uniform implant dose profile. The process of determining the non-uniform implant dose profile that is implemented in a subsequent processing activity is further described in relation to method 450 illustrated in FIG. 4B. The amount of correction that is required to be provided by the application of the implant profile to the as-deposited distortion correction layer 201 is based on the data collected during activity 402.

The system controller described herein can include a central processing unit (CPU) which is operable with a memory (e.g., non-volatile memory) and support circuits. The support circuits are conventionally coupled to the CPU and comprise cache, clock circuits, input/output subsystems, and the like, and combinations thereof coupled to the various components within one or more distortion correction structure processing tools, to facilitate control thereof. The CPU is one of any form of general purpose computer processor used in an industrial setting for controlling various components and sub-processors of the processing system. Typically, the memory is in the form of a non-transitory computer-readable storage media containing instructions (e.g., non-volatile memory), which when executed by the CPU, facilitates the operation of the one or more distortion correction structure processing tools. The computer instructions in the memory are in the form of a program product such as a program that implements the one or more portions of the methods of the present disclosure.

At activity 406, an as-deposited distortion correction layer 201 is formed on the back-side surface of the substrate 101. The process of forming the as-deposited distortion correction layer 201 can include depositing a dielectric containing layer on the back-side surface 103 by use of a chemical vapor deposition (CVD) process, a physical vapor deposition process (PVD), an atomic layer deposition (ALD) process or other useful deposition process. In one example, the as-deposited distortion correction layer 201 may include a silicon nitride ($Si_3N_4$) containing layer that is formed by a PVD or a CVD process. In some embodiments, the system controller determines the required thickness $T_{DCL}$ of the as-deposited distortion correction layer 201 based on the data collected during activity 402. The thickness $T_{DCL}$ can be selected based on aspects of the implant dose that is to be provided during activity 308, and thus the thickness $T_{DCL}$ of the as-deposited distortion correction layer 201 is adjusted based on implant dosing parameters used during activity 408. In some cases, it is desirable to set the thickness of the as-deposited distortion correction layer 201 to be thick enough to assure that the implanted ions provided during the implant process performed during activity 408 does not cause the implanted ions to be implanted into the back-side of the substrate 101. In some non-limiting examples, the as-deposited distortion correction layer 201 is a silicon nitride ($Si_xN_y$) film layer that has a thickness $T_{DCL}$ that is less than 4,000 Å, such as less than 2,000 Å, or between 1,000 Å and 2,000 Å.

At activity 408, the as-deposited distortion correction layer 201 is exposed to a non-uniform dose of an implanted ion that is based on the non-uniform implant dose profile determined during activity 404 so that the modified as-deposited distortion correction layer 201, which is referred to herein as the distortion correction layer 203, will correct for the complex substrate deformation shape. Suitable implanted ions provided from an ion beam may include any ion species capable of inducing a stress change after being implanted at a suitable ion energy, including ions such as phosphorous, boron, argon, nitrogen, krypton, indium, $BF_2$, according to some non-limiting embodiments, with ion energy being tailored according to the exact ion species used. The dose of implanted ions is applied to the as-deposited distortion correction layer 201 by use of an ion implant energy source, in order to correct the complex substrate deformation shape, and thus to reduce or minimize in-plane-distortion (IPD) that affects device fabrication and other device patterning procedures. Non-limiting examples of ion implant energy sources include an ion beam that is scannable with respect to back-side surface 103 of the substrate 101. In various embodiments, an ion implant energy source may transfer a non-uniform dose into a substrate that involves a non-uniform, direct write, process. In this context, a 'direct write' process, including a direct write implant process, may refer to a process that employs relative movement of an ion beam or other beam that is used to produce an adjustable non-uniform dose that is defined by the determined implant profile across the substrate surface. In some embodiments, a direct write process may involve an exposure to photons, such as a laser beam, and may be used to globally adjust stress in the as-deposited distortion correction layer 201 to adjust the complex curvature of a substrate, and thus the substrate's OPD. In some embodiments, the system controller determines the required implant process parameters, such ion energy (keV), dose amount (atoms/$cm^2$), and/or even atomic species, based on the data collected during activity 402 and even the thickness of the as-deposited distortion correction layer 201. In some embodiments, the method 400 is completed after performing activity 408 so that the substrate 101 can then be transferred on to one or more subsequent processing steps, such additional 3D memory device (e.g., 3D NAND device) processing steps. In one non-limiting example, the implant process includes implanting argon (Ar) atoms at a constant energy that varies between 50 and 100 keV into a silicon nitride ($Si_xN_y$) as-deposited distortion correction layer that has a thickness of about 1,300 Å and a dose of between $1\times10^{12}$ and $1\times10^{15}$ atoms/$cm^2$.

Distortion Correction Determination Process

FIG. 4B illustrates an embodiment of processes performed during activity 404, which is referred to herein as method 450. Method 450 begins at activity 452, based on measurements of the shape of an ion beam used to deliver the implant dose profile to desired portions of the surface of the substrate during activity 408, a Gaussian ion beam profile is generated. An example of a Gaussian ion beam profile is illustrated in FIG. 5C.

At activity 454, the Gaussian ion beam profile generated during activity 452 is resampled so that the resolution of the resampled Gaussian ion beam profile matches the resolution and attributes of the OPD data received during activity 402. An example of a resampled Gaussian ion beam profile is illustrated in FIG. 5D. The process of resampling the Gaussian ion beam profile will require correcting various attributes of the Gaussian filter generated in activity 454 based on known characteristics of the data provided in the received OPD data. First, the curvature data of the wafer is computed from the OPD data. Various measures of curvature such as Gaussian curvature, mean curvature, or X/Y curvature can be used and the methods described herein can be applied to any of the aforesaid measures of curvature. The resampled Gaussian ion beam profile (referred to as a "blur kernel") is then applied to the curvature data, as shown in FIG. 5G. The corresponding PSD data is shown in FIG. 5H. The application of the blur kernel includes convolution of the curvature data (in spatial domain) and the blur kernel (in spatial domain). The blur kernel serves as a spatial low-pass filter, when convolved with the curvature data received at activity 402, taking into account that the ion beam cannot physically address spatial frequencies larger than the limits imposed by the spatial characteristics of the beam itself.

Figure 6A:
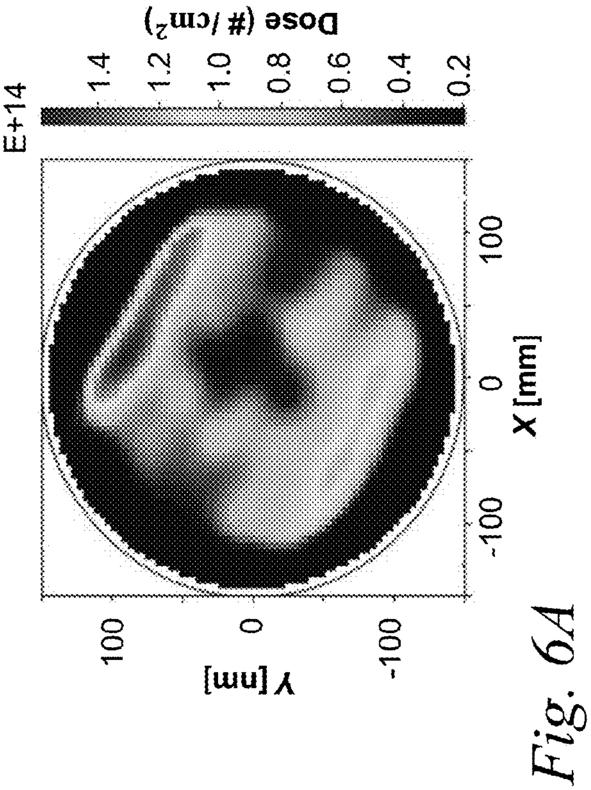
FIG. 6A illustrates a corrected curvature data of the example substrate that has been formed by applying one or more of the methods described herein to the OPD data illustrated in FIG. 5A, according to one or more of the embodiments described herein.
Figure 6B:
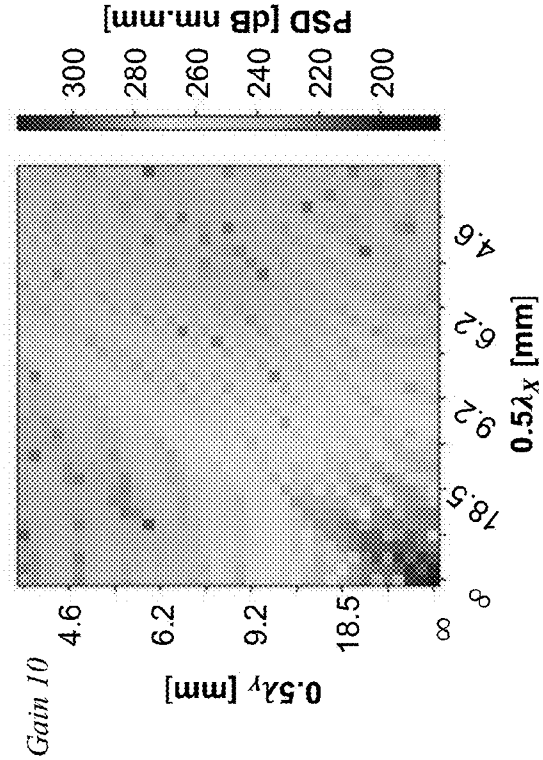
FIG. 6B illustrates a PSD data that corresponds to the corrected curvature data illustrated in FIG. 6A.

At activity 456, the Gaussian ion beam profile generated at activity 452 is Fourier transformed into the spatial frequency domain, as shown in FIG. 5E, and then resampled to match the resolution and attributes of the OPD data received during activity 402, as shown in FIG. 5F. The resampled Fourier-transformed Gaussian ion beam profile (referred to as an "inverse Gaussian filter") is then applied to the low-pass filtered curvature data (shown in FIG. 5G) generated at activity 454, to generate corrected curvature data, as shown in FIG. 6A. The corresponding PSD data is shown in FIG. 6B. By the process of filtering, the variation of the dose-sensitivity to curvature over spatial frequencies are taken into account, by essentially increasing the amplitude of the spectra at higher frequencies (i.e., in effect a spatial high-pass filter). While the spread of this Gaussian filter is defined by the beam characteristics, its gain is anchored to the fundamental spatial wavelength of 600 mm (corresponding to the wafer diameter of 300 mm) and is determined heuristically through experimentation. The filtering process performed in activity 456 essentially constitutes a simple multiplication of the spectra in the low-pass filtered curvature data (in the spatial frequency domain) with the inverse Gaussian filter (in the spatial frequency domain), instead of convolution of two data sets, since it is performed in the frequency domain, and can hence replace the computationally expensive step of a convolution in the spatial domain. When comparing the PSD data illustrated in FIG. 5H with the PSD data corresponding to the corrected curvature data illustrated in FIG. 6B, one can see that the higher frequencies shown in the FIG. 6B plot have been further emphasized (i.e., increased in magnitude) over the same frequencies shown in the PSD data in FIG. 5H, since the higher frequencies are harder to correct due to their higher mechanical stiffness, as noted above. While not intending to be limited by theory, the processes performed during activity 456 are used to amplify the energy in the spectral data at higher spatial frequencies while also subject to the constraints imposed by the ion beam's own physical spot size, as illustrated in FIG. 5C. Moreover, the resampled Gaussian filter is tuned to the beam characteristics to take into account the fact that the beam cannot physically address spatial frequencies larger than the limits imposed by its own spot size.

Figure 5I:
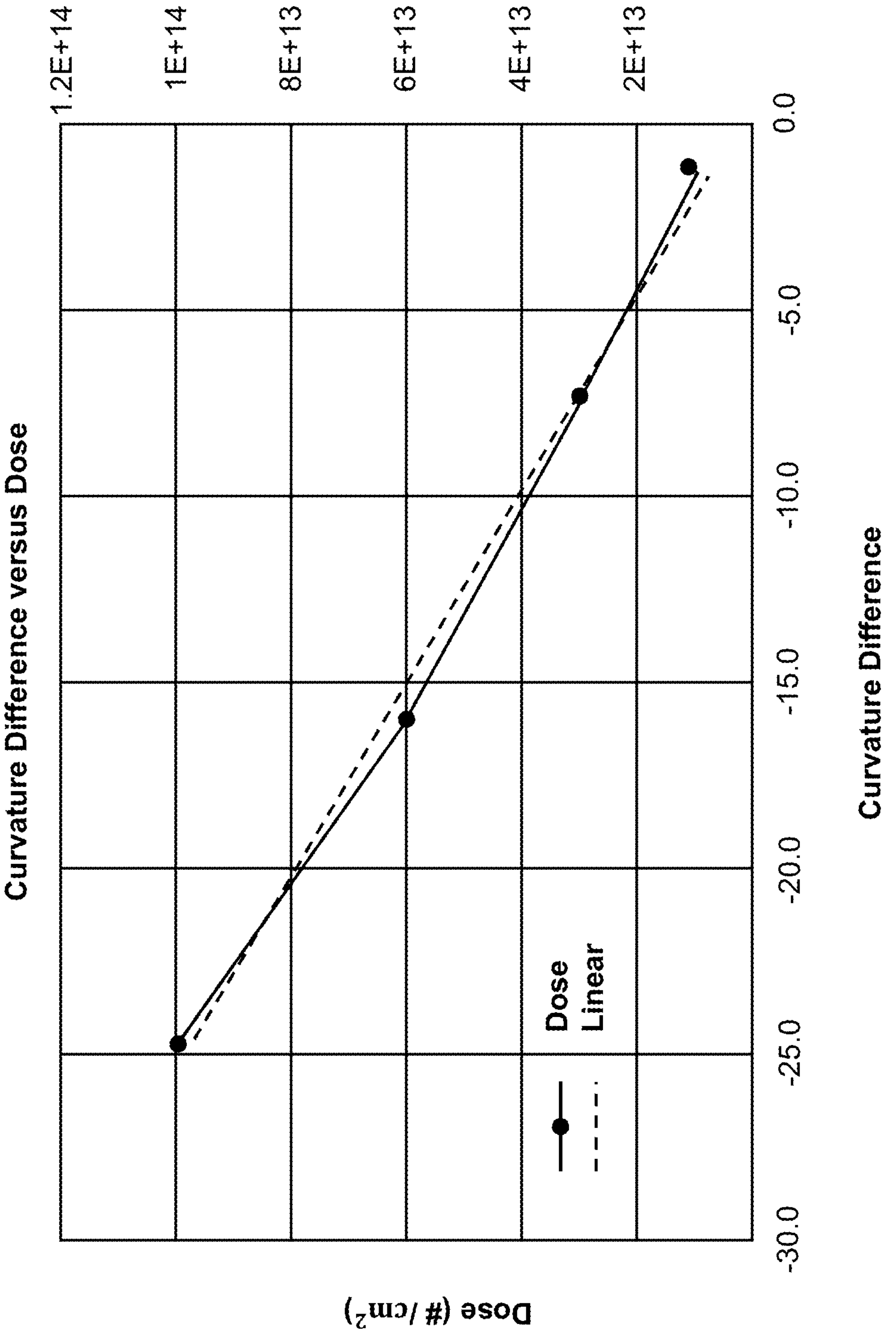
FIG. 5I illustrates an empirically generated dose sensitivity curve at a wavelength of 600 mm that is used in one or more of the methods described herein, according to one or more of the embodiments described herein.

At activity 458, the system controller computes an implant dose profile based on an empirically generated dose sensitivity curve and the corrected curvature data such that frequency and amplitude variations found in a distorted substrate are accounted for. FIG. 5I illustrates an empirically generated dose sensitivity curve at a wavelength of 600 mm corresponding to the 300 mm length scale of a silicon wafer that defines the effect of providing increasing amounts of a uniform implant dose to the distortion correction layer of the distortion correction structure. The dose sensitivity curve graph illustrated in FIG. 5I was created using a fixed ion energy level that was applied across the whole back-side surface of the substrate 101. The dose sensitivity is expected to decline exponentially at higher spatial frequencies and this needs to be taken into account while computing a dose profile. This is done by applying the inverse Gaussian filter to the low-pass filtered curvature data.

The application of the dose sensitivity curve to the corrected curvature data then allows the implant dose profile curve to be generated so that the generated implant dose profile curve can then be used in activity 408, which is described above. The generated implant dose profile curve allows amplitude variations found within the complex deformation shape of the substrate to be adjusted without the need for separate adjustments for spatial frequency variations, since the frequency component of the implant dose profile curve has already been accounted for by use of method 450.

Figure 6D:
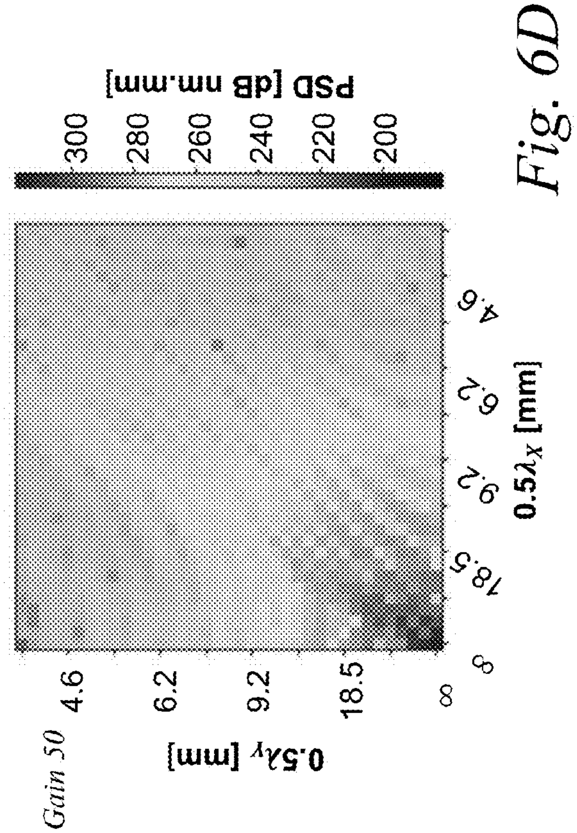
FIG. 6D illustrates a PSD data that corresponds to the corrected curvature data illustrated in FIG. 6C.
Figure 6C:
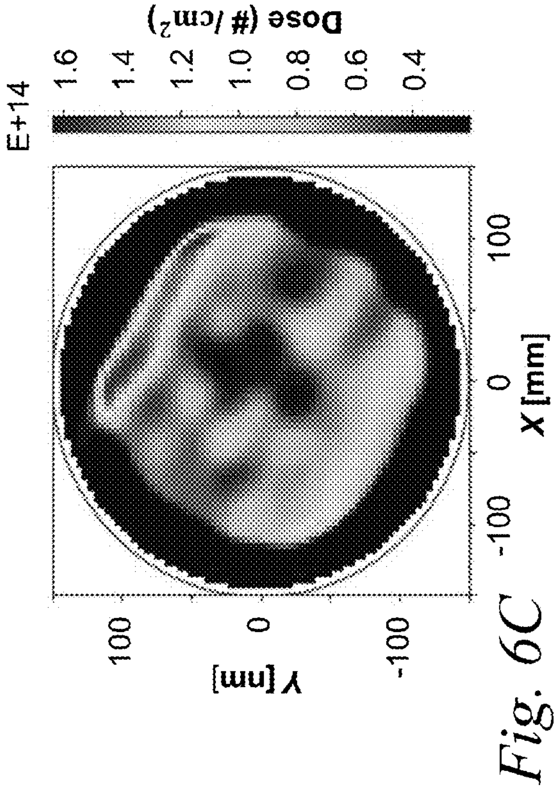
FIG. 6C illustrates a corrected curvature data of the example substrate that has been formed by applying one or more of the methods described herein to the OPD data illustrated in FIG. 5A, according to one or more of the embodiments described herein.
Figure 6F:
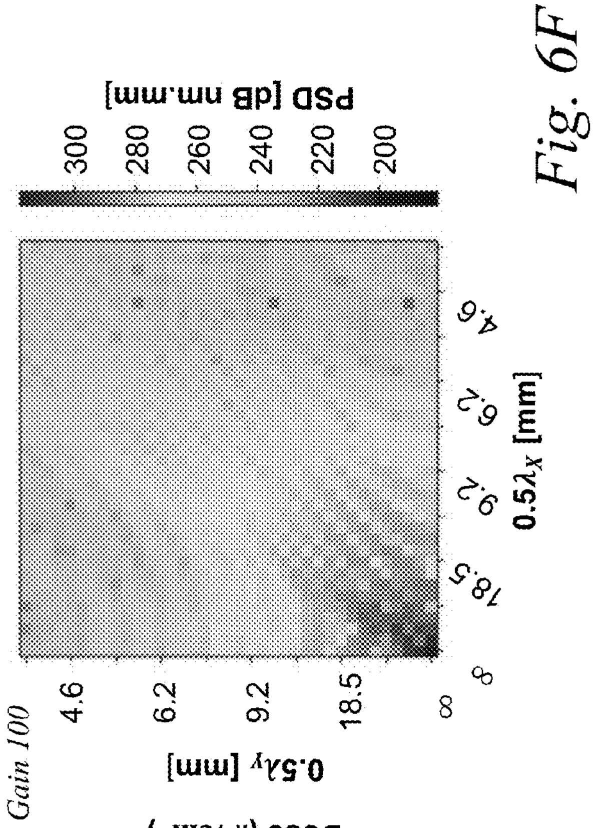
FIG. 6F illustrates a PSD data that corresponds to the corrected curvature data illustrated in FIG. 6E.
Figure 6E:
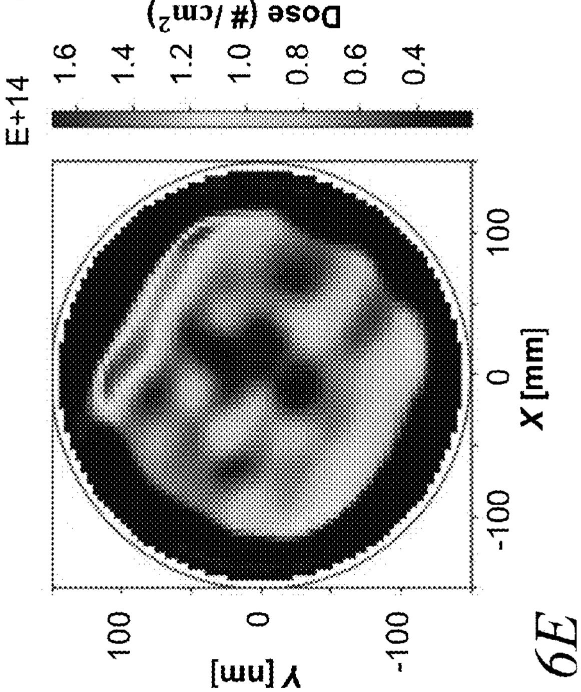
FIG. 6E illustrates a corrected curvature data of the example substrate that has been formed by applying one or more of the methods described herein to the OPD data illustrated in FIG. 5A, according to one or more of the embodiments described herein.

FIGS. 6C and 6D are the generated corrected curvature data and the corresponding PDS data, respectively, with an increased gain level (5 times of that in data shown in FIGS. 6A and 6B) during the activity 456. FIGS. 6E and 6F are the generated corrected curvature data and the corresponding PDS data, respectively, with an increased gain level (100 times of that in data shown in FIGS. 6A and 6B) during the activity 456. The added gains are used to further emphasize the lower spatial frequencies in final implant dose profile curve. Applying an increased gain essentially compensates for the reduced dose sensitivity at higher spatial frequencies by compensating the spectra a priori.

Global Substrate Bow Correction Process

The embodiments described below relate to techniques and apparatus for reducing a global out-of-plane distortion (OPD) in a substrate, as well as control of the effects of OPD and the effects that the modifications made to the substrate to correct for the OPD have on subsequent substrate processing operations performed on the substrate. The present embodiments employ novel techniques to reduce the OPD in a substrate without adding or modifying portions of the substrate that will create issues in subsequent substrate fabrication processes. The processes described below can be performed prior to performing the methods 400 and 450 described above, and thus are used to compensate for a global substrate bow before the complex deformation shapes and sought to be removed by use of the methods described above.

It has been found that as the thickness of a layer that is used to compensate for large global deformations of a substrate (i.e., FIG. 1A) increases many processing problems are created in subsequent substrate processing processes. The need for a thick stress compensation layer to compensate for a substrate's large global substrate bow, has been found to increase the likelihood that a substrate will become damaged or broken during subsequent processing steps. To resolve the large global deformations found in a substrate a distortion correction structure and process sequence to form the same has been developed and is disclosed below.

Figure 7:
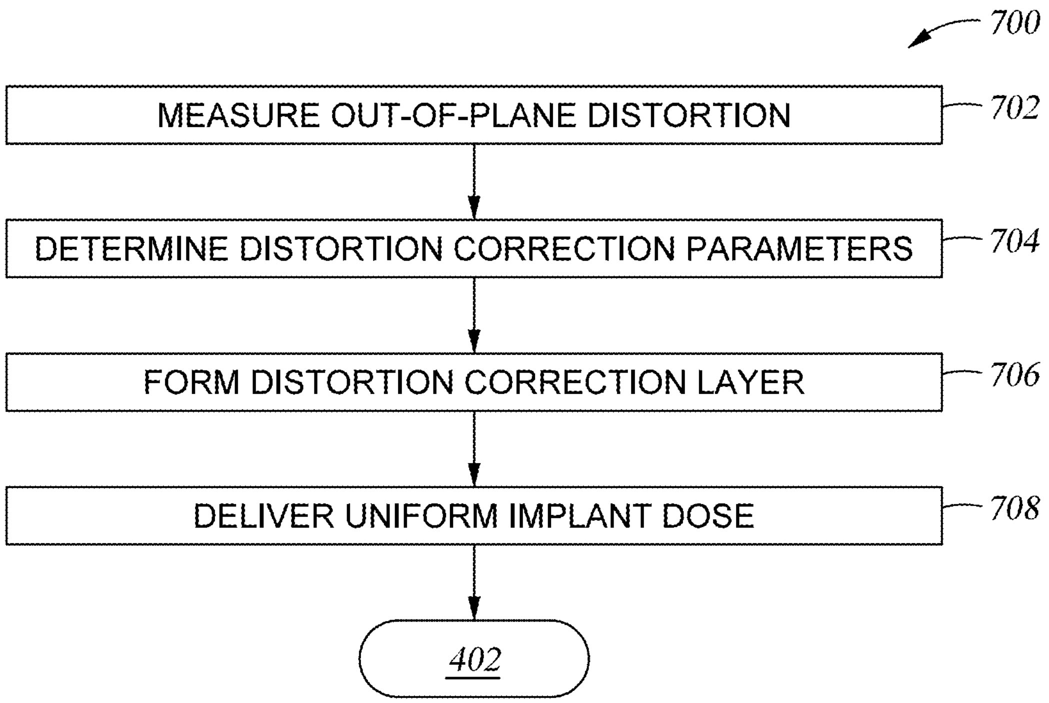
FIG. 7 illustrates a method 700 of forming a distortion correction structure used to alter a global substrate bow prior to performing methods illustrated in FIGS. 4A and 4B, according to one or more of the embodiments described herein.
Figure 8:
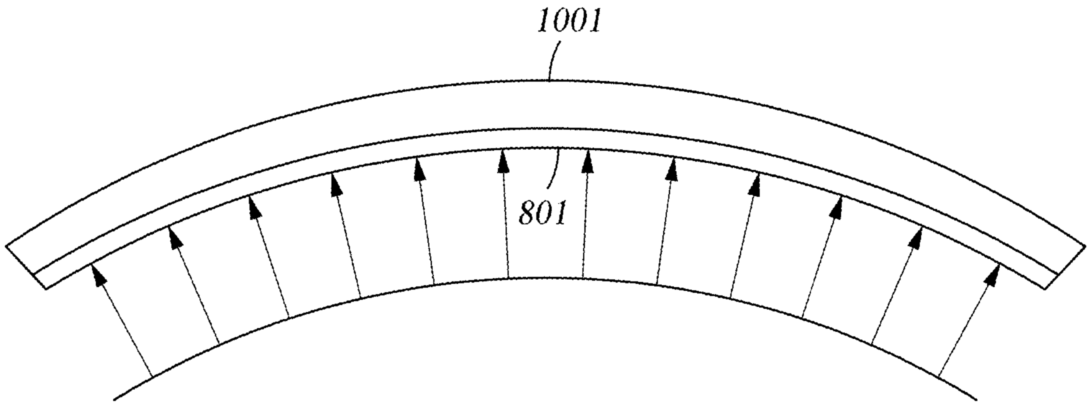
FIG. 8 illustrates a portion of a distortion correction structure forming process that has been performed on the substrate shown in FIG. 7, according to one or more of the embodiments described herein.

FIG. 7 illustrates a method 700 for use in the formation of a distortion correction structure 802 that is used to compensate for the OPD found in the substrate 101, according to one or more of the embodiments described herein. Method 700 can be performed prior to performing activity 402 of the method 400. In embodiments where method 700 is performed before performing the method 400, the processes performed in activity 406 are not necessary since the distortion correction layer has been formed during the performance of activity 706 of method 700. FIG. 8 are schematic side cross-sectional views of a substrate 101 during a stage of the distortion correction structure 802 formation method illustrated in FIG. 7, according to one or more of the embodiments described herein. In general, the distortion correction structure 802 formation process includes the deposition of a distortion correction layer 801 that has a thickness $T_{DCL}$, and then expose the deposited distortion correction layer 801 formed on the back-side surface 103 (FIGS. 1A and 8) of the substrate 101 to a uniform implant dose to correct the global OPD in the substrate 101.

The method 700 begins at activity 702, where the OPD of a substrate 101 is measured by use of conventional substrate bow measurement techniques. Conventional measurement techniques can be performed by use of a WaferSight™ tool available from KLA of Milpitas, California, a Metrology System from MTI Instruments of Albany, NY or other similar substrate bow measurement tool.

At activity 704, the system controller (not shown) within one or more distortion correction structure processing tools determines the desired amount of correction that is required by one or more of the various parts of a distortion correction structure 802 that is to be formed on the back-side surface of the substrate 101. The determined amount of correction that is required is based on the data collected during activity 702.

At activity 706, the as-deposited distortion correction layer 801 is formed on the back-side surface of the substrate 101. The process of forming the as-deposited distortion correction layer 801 can include depositing a dielectric containing layer on the back-side surface 103 by use of a chemical vapor deposition (CVD) process, a physical vapor deposition process (PVD), an atomic layer deposition (ALD) process or other useful deposition process. The thickness $T_{DCL}$ of the as-deposited distortion correction layer 801 is selected by use of the prior activities such that it is less than the thickness required to fully compensate for the global OPD of the substrate 101, and also have a thickness that will assure that the distortion correction structure 802 will not create problems in any subsequent manufacturing processes, such as, for example, processes that require the use of an electrostatic chuck. In one example, the as-deposited distortion correction layer 801 may include a silicon nitride ($Si_3N_4$) containing layer that is formed by a CVD process. In some embodiments, the system controller determines the required thickness $T_{DCL}$ of the as-deposited distortion correction layer 801 based on the data collected during activity 702. The thickness $T_{DCL}$ can be selected based on aspects of the implant dose that is to be provided during activity 708, and thus the thickness $T_{DCL}$ of the as-deposited distortion correction layer 801 is adjusted based on implant dosing parameters used during activity 708. In some cases, it is desirable to set the thickness of the as-deposited distortion correction layer 801 to be thick enough to assure that the implant atoms provided during the implant process performed during activity 708 does not cause the implanted atoms to be implanted into the back-side of the substrate 101. In some non-limiting examples, the as-deposited distortion correction layer 801 is silicon nitride ($Si_xN_y$) film layer that has a thickness $T_{DCL}$ that is less than 4,000 Å, such as less than 2,000 Å, or between 1,000 Å and 2,000 Å. As noted above, in embodiments where method 700 is performed before performing the method 400, the processes performed in activity 406 are not necessary since a distortion correction layer, which takes the place of the as-deposited distortion correction layer 201, has been formed during the performance of activity 706 of method 700.

At activity 708, the as-deposited distortion correction layer 801 is exposed to a uniform dose of an implanted atom so that the modified as-deposited distortion correction layer 801, which is referred to herein as the distortion correction layer 803, will correct for the global OPD. Suitable implanted ions provided from an ion beam may include any ion species capable of inducing a stress change after being implanted at a suitable ion energy, including ions such as phosphorous, boron, argon, nitrogen, krypton, indium, $BF_2$, according to some non-limiting embodiments, with ion energy being tailored according to the exact ion species used. The dose of implanted ions is applied to the as-deposited distortion correction layer 801 by use of an ion implant energy source, in order to correct global OPD, and thus to reduce or minimize in-plane-distortion (IPD) that affects device fabrication and other device patterning procedures. Non-limiting examples of ion implant energy sources include an ion beam that is scannable with respect to back-side surface 103 of the substrate 101. In various embodiments, an ion implant energy source may transfer a dose into a substrate that involves a uniform, direct write, process. In this context, a 'direct write' process, including a direct write implant process, may refer to a process that employs relative movement of an ion beam or other beam that is used to produce a uniform dose across a substrate surface. In some embodiments, a direct write process using an ion implant energy source may involve an exposure to electrons, such as an electron beam, or photons, such as a laser beam, may be used to globally adjust stress in the as-deposited distortion correction layer 801 to adjust the curvature of a substrate, and thus the substrate's OPD. In some embodiments, the system controller determines the required implant process parameters, such ion energy (keV), dose amount (atoms/$cm^2$), and/or even atomic species, based on the data collected during activity 702 and the thickness of the as-deposited distortion correction layer 801. In some embodiments, the method 700 is completed after performing activity 708 so that the substrate 101 can then be transferred on to one or more subsequent processing steps, such as the processes performed during method 400. In one non-limiting example, the implant process includes implanting argon (Ar) ions at a constant energy, such as 65 keV into a silicon nitride ($Si_xN_y$) as-deposited distortion correction layer that has a thickness of about 1,300 Å and a dose of between $1\times10^{13}$ and $1\times10^{14}$ atoms/$cm^2$. In another non-limiting example, the implant process includes implanting Ar ions at a constant energy, such as 70 keV into a silicon nitride ($Si_xN_y$) as-deposited distortion correction layer that has a thickness of about 2,000 Å to correct a global OPD of about 300 μm.

In one embodiment of activity 708, as incoming global substrate bow increases a higher implant dopant dose and/or larger implant species are used to correct for the bow, while the implant energy is typically adjusted to make sure total dose remains within the as-deposited distortion correction layer 801.

After performing the steps within method 700 activity 402 of the method 400 can then be performed.

While the foregoing is directed to embodiments of the present disclosure, other and further embodiments of the disclosure may be devised without departing from the basic scope thereof, and the scope thereof is determined by the claims that follow.

I claim:

1. A method of altering a shape of a substrate, comprising:

generating an ion beam profile based on a measured shape of an ion beam;

resampling the ion beam profile to generate a blur kernel, by adjusting a resolution of the ion beam profile to match a resolution of an out-of-plane distortion (OPD) data measured on the substrate having OPD shapes formed therein;

computing curvature data from the OPD data;

filtering the curvature data by applying the blur kernel to the curvature data;

generating an inverse filter, by Fourier transforming the ion beam profile and resampling the Fourier transformed ion beam profile by matching a resolution of the Fourier transformed ion beam profile to a resolution of the curvature data;

applying the inverse filter to the filtered curvature data to generate corrected curvature data;

computing an implant dose map based on an empirically generated dose sensitivity curve and the corrected curvature data; and delivering a varying amount of an implant dopant to a back-side surface of the substrate based on the computed implant dose map, to correct the OPD shapes formed in the substrate.

2. The method of claim 1, wherein the ion beam profile comprises a Gaussian ion beam profile.

3. The method of claim 2, wherein filtering the curvature data comprises using the filtering process as a low-pass filter.

4. The method of claim 1, further comprising depositing a dielectric layer on the back-side surface of the substrate, by use of a chemical vapor deposition (CVD) process, a physical vapor deposition process (PVD), an atomic layer deposition (ALD) process or other useful deposition process, before delivering the varying amount of the implant dopant to the back-side surface of the substrate.

5. The method of claim 4, wherein the dielectric layer comprises silicon nitride that has a thickness less than 4,000 Å.

6. The method of claim 5, wherein the implant dopant comprises phosphorous, boron, argon, nitrogen, krypton, indium, or $BF_2$.

7. The method of claim 1, wherein the implant dose map comprises an implant dose profile that specifies an ion energy and an ion dose amount to be applied to at least two or more regions on a back-side surface of the substrate.

8. A method of altering a deformed shape of a substrate, comprising:

receiving out-of-plane distortion (OPD) data of a back-side surface of a substrate;

computing an implant dose profile to deliver to the back-side surface of the substrate, comprising:

generating an ion beam profile based on a measured shape of an ion beam;

resampling the ion beam profile to generate a blur kernel, by adjusting a resolution of the ion beam profile to match a resolution of an out-of-plane distortion (OPD) data measured on the substrate;

computing curvature data from the OPD data;

filtering the curvature data, by applying the blur kernel to the curvature data;

generating an inverse filter, by Fourier transforming the ion beam profile and resampling the Fourier transformed ion beam profile by matching a resolution of the Fourier transformed ion beam profile to a resolution of the curvature data;

applying the inverse filter to the filtered curvature data to generate corrected curvature data; and computing an implant dose profile based on an empirically generated dose sensitivity curve and the corrected curvature data;

depositing, by use of a chemical vapor deposition (CVD) process, a physical vapor deposition process (PVD), an atomic layer deposition (ALD) process or other useful deposition process, a distortion correction layer on the back-side surface of the substrate; and applying an ion beam having the computed implant dose profile to the distortion correction layer.

9. The method of claim 8, wherein the distortion correction layer comprises a first material that has a compressive or tensile stress as-deposited on the back-side surface of the substrate and has a thickness.

10. The method of claim 9, wherein applying the ion beam comprises:

implanting dopant species across a surface of the first material deposited on the back-side surface of the substrate, by exposing the surface of the first material to the ion beam having the computed implant dose profile that is scanned across the surface of the first material.

11. The method of claim 10, wherein the computed implant dose profile includes at least one of ion energy and dose of the ions.

12. The method of claim 10, wherein dopant species argon (Ar) or phosphorous (P).

13. The method of claim 10, wherein a front-side surface of the substrate comprises a plurality of semiconductor device layers that are configured to form at least a portion of a 3D memory device.

14. The method of claim 8, further comprising:

receiving global substrate bow measurement information that comprises global out-of-plane-distortion information formed in the substrate that comprises a plurality of semiconductor device layers formed on a front-side surface of the substrate; and determining at least one global distortion correction parameter that is used to form a distortion correction structure that is formed on the back-side surface of the substrate.

* * * * *